(12) United States Patent     (10) Patent No.:   US 12,566,219 B2
Mei et al.              (45) Date of Patent:     Mar. 3, 2026

(54) FAULT DETECTION METHOD AND APPARATUS FOR THREE PHASE POWER SUPPLY CIRCUIT OF FREQUENCY CONVERTER, AND AIR CONDITIONER

(71) Applicants:HEFEI MIDEA HEATING & VENTILATING EQUIPMENT CO., LTD., Hefei (CN); GD MIDEA HEATING & VENTILATING EQUIPMENT CO., LTD., Foshan (CN)

(72) Inventors: Lijun Mei, Hefei (CN); Tian Wu, Hefei (CN); Zhanghai Xie, Hefei (CN); Xiangyun Huang, Hefei (CN); Xulang Chen, Hefei (CN)

(73) Assignees: HEFEI MIDEA HEATING & VENTILATING EQUIPMENT CO., LTD., Hefei (CN); GD MIDEA HEATING & VENTILATING EQUIPMENT CO., LTD., Foshan (CN)

( * ) Notice: Subject to any disclaimer, the term of this patent is extended or adjusted under 35 U.S.C. 154(b) by 202 days.

(21) Appl. No.: 18/564,614

(22) PCT Filed: May 18, 2023

(86) PCT No.: PCT/CN2023/094955
§ 371 (c)(1),
(2) Date: Nov. 28, 2023

(87) PCT Pub. No.: WO2023/186184
PCT Pub. Date: Oct. 5, 2023

(65) Prior Publication Data
US 2024/0377474 A1     Nov. 14, 2024

(30) Foreign Application Priority Data
Apr. 2, 2022    (CN) .......................... 202210344006.5

(51) Int. Cl.
*G01R 31/42*      (2006.01)
*F24F 11/38*      (2018.01)
*F24F 11/63*      (2018.01)

(52) U.S. Cl.
CPC .............. *G01R 31/42* (2013.01); *F24F 11/38* (2018.01); *F24F 11/63* (2018.01)

(58) Field of Classification Search
CPC   G01R 31/42; G01R 31/2825; G01R 31/2843; F24F 11/38; F24F 11/63
(Continued)

(56) References Cited

U.S. PATENT DOCUMENTS

2008/0180087 A1*   7/2008   Pankau .................. H02H 3/253
                                   324/76.74
2017/0234936 A1*   8/2017   Schrepfer ................ G01R 1/20
                                   324/764.01

FOREIGN PATENT DOCUMENTS

CN       1828319 A     9/2006
CN     102323491 A     1/2012
(Continued)

OTHER PUBLICATIONS

ISR received in PCT/CN2023/094955; mailed Sep. 6, 2023.
(Continued)

*Primary Examiner* — Marc E Norman
(74) *Attorney, Agent, or Firm* — K&L Gates LLP

(57) ABSTRACT

A fault detection method and apparatus for a three-phase power supply circuit of a frequency converter, and an air conditioner. The fault detection method for the three-phase power supply circuit of the frequency converter includes: when a fault occurs in the three-phase power supply circuit, increasing a current or power of a load of the three-phase power supply circuit; quickly determining a fault type of the three-phase power supply circuit according to a frequency of
(Continued)

When a fault occurs in the three-phase power supply circuit, increase a current or power of a load of the three-phase power supply circuit     ⌐S101

Determine, according to a frequency of a ripple voltage of a bus voltage of the three-phase power supply circuit with increased load, a fault type of the three-phase power supply circuit     ⌐S102 a ripple voltage of a bus voltage. In this way, the fault type of the three-phase power supply circuit can be quickly determined simply based on the main loop of the three-phase power supply circuit.

6 Claims, 5 Drawing Sheets

(58) Field of Classification Search
USPC .................................. 324/500, 512, 764.01
See application file for complete search history.

(56) References Cited

FOREIGN PATENT DOCUMENTS

| | | | |
|---|---|---|---|
| CN | 102778612 | A | 11/2012 |
| CN | 103033769 | A | 4/2013 |
| CN | 202997527 | U | 6/2013 |
| CN | 103033769 | B | 1/2015 |
| CN | 109900975 | A | 6/2019 |
| CN | 112067912 | A | 12/2020 |
| CN | 113391139 | A | 9/2021 |
| CN | 113740623 | A | 12/2021 |
| CN | 114705971 | A | 7/2022 |
| JP | H11206003 | A | 7/1999 |
| JP | 2006033904 | A | 2/2006 |
| KR | 20060022945 | A | 3/2006 |

OTHER PUBLICATIONS

The First Office Action received in the counterpart CN application 202210344006.5, mailed on Mar. 21, 2025, 14 pages with English translation.

* cited by examiner

| | |
|---|---|
| Obtain a bus voltage when the three-phase power supply circuit is operating | S201 |
| ↓ | |
| Determine, according to an amplitude of a ripple voltage of the bus voltage and a frequency of the ripple voltage of the bus voltage, whether a fault occurs in the three-phase power supply circuit | S202 |

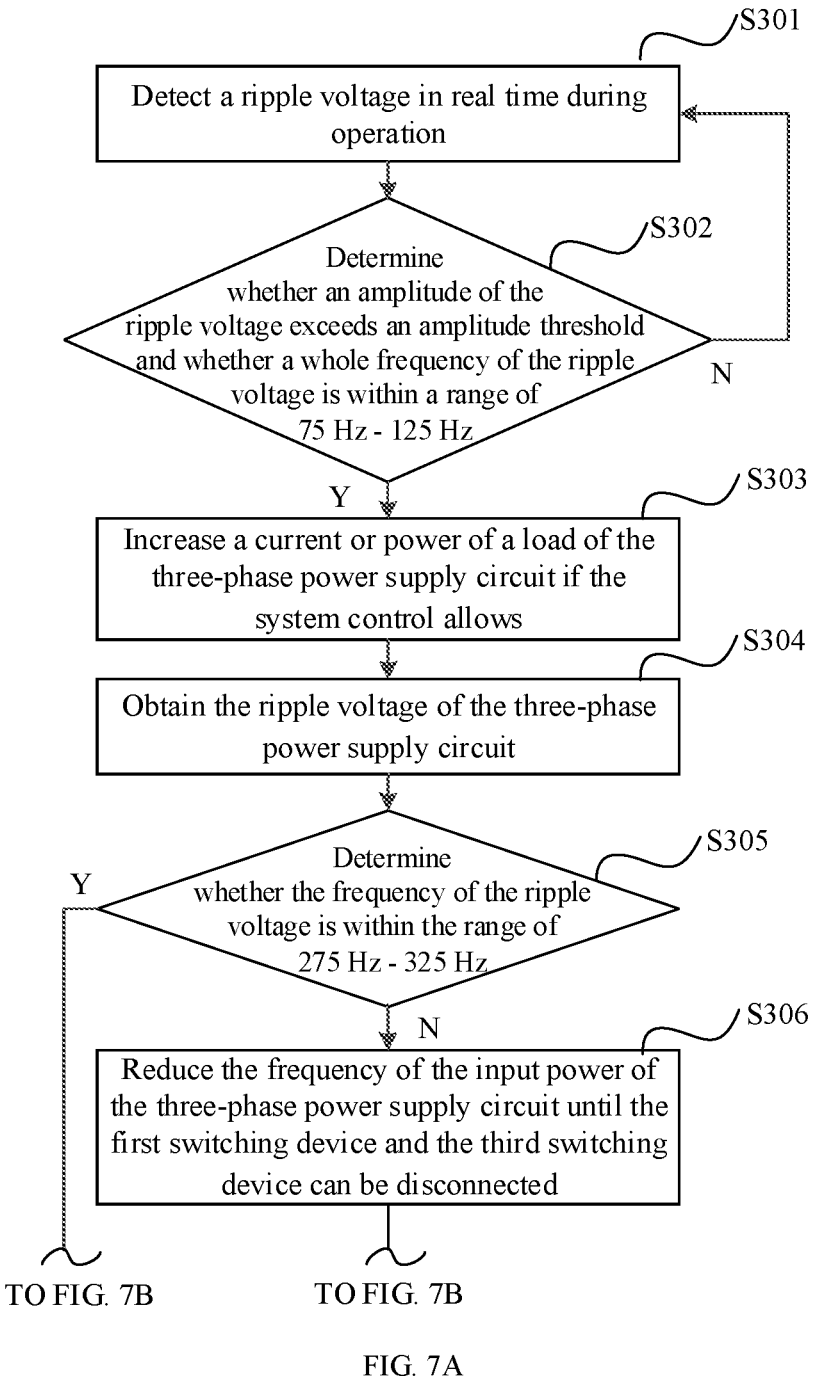

S301

Detect a ripple voltage in real time during operation

S302

Determine whether an amplitude of the ripple voltage exceeds an amplitude threshold and whether a whole frequency of the ripple voltage is within a range of 75 Hz - 125 Hz

N

Y

S303

Increase a current or power of a load of the three-phase power supply circuit if the system control allows

S304

Obtain the ripple voltage of the three-phase power supply circuit

S305

Determine whether the frequency of the ripple voltage is within the range of 275 Hz - 325 Hz

Y

N

S306

Reduce the frequency of the input power of the three-phase power supply circuit until the first switching device and the third switching device can be disconnected

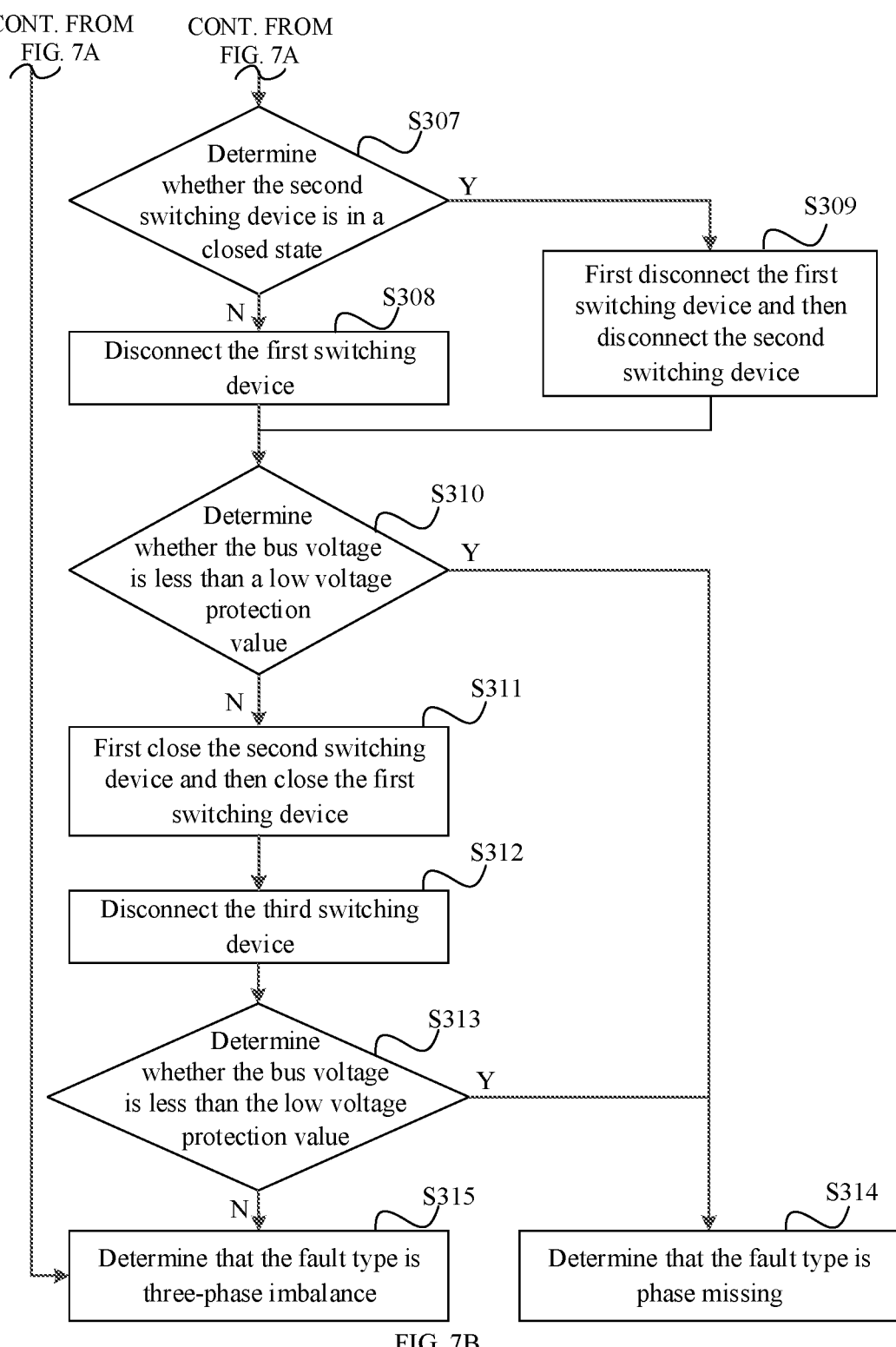

CONT. FROM
FIG. 7A

CONT. FROM
FIG. 7A

S307
Determine whether the second switching device is in a closed state

Y

S309
First disconnect the first switching device and then disconnect the second switching device

N

S308
Disconnect the first switching device

S310
Determine whether the bus voltage is less than a low voltage protection value

Y

N

S311
First close the second switching device and then close the first switching device S312
Disconnect the third switching device S313
Determine whether the bus voltage is less than the low voltage protection value

Y

N

S315
Determine that the fault type is three-phase imbalance

S314
Determine that the fault type is phase missing

FIG. 7B

FAULT DETECTION METHOD AND APPARATUS FOR THREE PHASE POWER SUPPLY CIRCUIT OF FREQUENCY CONVERTER, AND AIR CONDITIONER

CROSS-REFERENCES TO RELATED APPLICATIONS

The present disclosure is a national phase application of International Application No. PCT/CN2023/094955, filed on May 18, 2023, which claims priority to Chinese patent application No. 202210344006.5 filed with the China National Intellectual Property Administration on Apr. 2, 2022, the entireties of which are herein incorporated by reference.

FIELD

The present disclosure relates to the field of air conditioning equipment technologies and, in particular, to a fault detection method and apparatus for a three-phase power supply circuit of a frequency converter and an air conditioner.

BACKGROUND

A three-phase power supply (for example, three-phase five-wire system) is generally used due to high power of an outdoor machine of a central air conditioner. Compared with a single-phase power supply, there may be some problems in the three-phase power supply, such as a wrong phase sequence, missing phase and three-phase imbalance. In view of the wrong phase sequence, because the current central air conditioners all adopt full frequency conversion technology, the wrong phase sequence will not affect the normal operation of the central air conditioners. In view of the phase missing and three-phase imbalance, a separate fault detection circuit will be set up in related art for detection, to determine a fault type when a fault occurs in the three-phase power supply circuit. However, the separate fault detection circuit needs to introduce three-phase force electricity into the control board, and it needs a high-power resistor for voltage reduction, thus causing serious heating; besides, the separate fault detection circuit occupies a large area of a printed circuit board (Printed Circuit Board, PCB), and the circuit structure of the three-phase power supply circuit is complicated. The detection of the fault type of the three-phase power supply circuit cannot be realized quickly by only relying on the main loop of the existing three-phase power supply circuit of the frequency converter.

SUMMARY

The main purpose of the present disclosure is to provide a fault detection method and apparatus for a three-phase power supply circuit of a frequency converter and an air conditioner.

The fault detection method for the three-phase power supply circuit of the frequency converter provided by some embodiments of the present disclosure includes:

when a fault occurs in the three-phase power supply circuit, increasing a current or power of a load of the three-phase power supply circuit;

determining, according to a frequency of a ripple voltage of a bus voltage of the three-phase power supply circuit with increased load, a fault type of the three-phase power supply circuit.

Some embodiments of the present disclosure have the advantages that when a fault occurs in the three-phase power supply circuit, the current or power of the load of the three-phase power supply circuit is increased, and the fault type of the three-phase power supply circuit can be determined according to the frequency of the ripple voltage of the bus voltage after the current or power is increased, in this way, the fault type of the three-phase power supply circuit can be quickly determined simply based on the main loop of the three-phase power supply circuit.

On the basis of the above embodiments, the following improvements can also be made in the present disclosure.

In some embodiments, determining, according to the frequency of the ripple voltage of the bus voltage of the three-phase power supply circuit with increased load, the fault type of the three-phase power supply circuit includes:

if the frequency of the ripple voltage of the bus voltage of the three-phase power supply circuit with increased load is within a first frequency range, determining that the fault type of the three-phase power supply circuit is three-phase imbalance.

In some embodiments, the first frequency range is 5.5 times to 6.5 times a frequency of an input power of the three-phase power supply circuit.

In some embodiments, before increasing the current or power of the load of the three-phase power supply circuit, the method further includes:

if an amplitude of the ripple voltage of the bus voltage of the three-phase power supply circuit is greater than an amplitude threshold and the frequency of the ripple voltage of the bus voltage is within a second frequency range, determining that the fault occurs in the three-phase power supply circuit.

In some embodiments, the second frequency range is 1.5 times to 2.5 times a frequency of an input power of the three-phase power supply circuit.

In some embodiments, determining, according to the frequency of the ripple voltage of the bus voltage of the three-phase power supply circuit with increased load, the fault type of the three-phase power supply circuit includes:

if the frequency of the ripple voltage of the bus voltage is not within a first frequency range, switching a switching state of a switching device in the three-phase power supply circuit to adjust the bus voltage of the three-phase power supply circuit;

determining the fault type of the three-phase power supply circuit according to the adjusted bus voltage of the three-phase power supply circuit.

In some embodiments, switching the switching state of the switching device in the three-phase power supply circuit includes:

controlling a first switching device in the three-phase power supply circuit to be disconnected, where the first switching device is connected in series on a first phase live line of the three-phase power supply circuit.

In some embodiments, if the three-phase power supply circuit further includes a second switching device connected in parallel with the first switching device, after controlling the first switching device in the three-phase power supply circuit to be disconnected, the method further includes:

if the second switching device is in a closed state, disconnecting the second switching device.

In some embodiments, determining the fault type of the three-phase power supply circuit according to the adjusted bus voltage of the three-phase power supply circuit includes:

if the adjusted bus voltage of the three-phase power supply circuit is less than a voltage threshold, determining that the fault type of the three-phase power supply circuit is phase missing.

In some embodiments, switching the switching state of the switching device in the three-phase power supply circuit includes:

controlling a second switching device in the three-phase power supply circuit and a first switching device in the three-phase power supply circuit to close sequentially;

controlling a third switching device in the three-phase power supply circuit to be disconnected, where the third switching device is connected in series on a second phase live line of the three-phase power supply circuit.

In some embodiments, determining the fault type of the three-phase power supply circuit according to the adjusted bus voltage of the three-phase power supply circuit includes:

if the adjusted bus voltage of the three-phase power supply circuit is less than a voltage threshold, determining that the fault type of the three-phase power supply circuit is phase missing;

if the adjusted bus voltage of the three-phase power supply circuit is greater than or equal to the voltage threshold, determining that the fault type of the three-phase power supply circuit is three-phase imbalance.

A fault detection apparatus for a three-phase power supply circuit of a frequency converter provided by some embodiments of the present disclosure includes:

a controlling device, configured to increase a current or power of a load of the three-phase power supply circuit when a fault occurs in the three-phase power supply circuit; and a determining device, configured to determine a fault type of the three-phase power supply circuit according to a frequency of a ripple voltage of a bus voltage of the three-phase power supply circuit with increased load.

In some embodiments, the determining device is configured to: determine that the fault type of the three-phase power supply circuit is three-phase imbalance, if the frequency of the ripple voltage of the bus voltage of the three-phase power supply circuit with increased load is within a first frequency range.

In some embodiments, the first frequency range is 5.5 times to 6.5 times a frequency of an input power of the three-phase power supply circuit.

In some embodiments, the determining device is further configured to determine that the fault occurs in the three-phase power supply circuit, if an amplitude of the ripple voltage of the bus voltage of the three-phase power supply circuit is greater than an amplitude threshold and the frequency of the ripple voltage of the bus voltage is within a second frequency range.

In some embodiments, the second frequency range is 1.5 times to 2.5 times a frequency of an input power of the three-phase power supply circuit.

In some embodiments, the determining device is configured to: if the frequency of the ripple voltage is not within a first frequency range, switch a switching state of a switching device in the three-phase power supply circuit to adjust the bus voltage of the three-phase power supply circuit; and determine the fault type of the three-phase power supply circuit according to the adjusted bus voltage of the three-phase power supply circuit.

In some embodiments, the determining device is configured to control a first switching device in the three-phase power supply circuit to be disconnected, where the first switching device is connected in series on a first phase live line of the three-phase power supply circuit.

In some embodiments, if the three-phase power supply circuit further includes a second switching device connected in parallel with the first switching device, the determining device is configured to disconnect the second switching device if the second switching device is in a closed state.

In some embodiments, the determining device is configured to determine that the fault type of the three-phase power supply circuit is phase missing, if the adjusted bus voltage of the three-phase power supply circuit is less than a voltage threshold.

In some embodiments, the determining device is configured to control a second switching device in the three-phase power supply circuit and a first switching device in the three-phase power supply circuit to close sequentially; and control a third switching device in the three-phase power supply circuit to be disconnected, where the third switching device is connected in series on a second phase live line of the three-phase power supply circuit.

In some embodiments, the determining device is configured to determine that the fault type of the three-phase power supply circuit is phase missing if the adjusted bus voltage of the three-phase power supply circuit is less than a voltage threshold; and determine that the fault type of the three-phase power supply circuit is three-phase imbalance if the adjusted bus voltage of the three-phase power supply circuit is greater than or equal to the voltage threshold.

Some embodiments in the present disclosure provide a chip which is connected to a three-phase power supply circuit;

the chip includes a processor and a memory;

the processor is configured to call and run a computer program from the memory, to cause the device equipped with the chip to execute the fault detection method for the three-phase power supply circuit of the frequency converter of some embodiment.

Some embodiments in the present disclosure provide an air conditioner which includes:

a controller, a three-phase power supply circuit and a compressor;

the controller is configured to execute the fault detection method for the three-phase power supply circuit of the frequency converter in some embodiments, and the three-phase power supply circuit is configured to provide power supply for the compressor;

the compressor is configured to support cooling or heating of the air conditioner.

Some embodiments in the present disclosure provide a fault detection method for a three-phase power supply circuit of a frequency converter, and an air conditioner. The fault detection method for the three-phase power supply circuit of the frequency converter includes: when a fault occurs in the three-phase power supply circuit, increasing a current or power of a load of the three-phase power supply circuit, and determining, according to a frequency of a ripple voltage of a bus voltage of the three-phase power supply circuit with increased load, a fault type of the three-phase power supply circuit. According to the fault detection method and apparatus for the three-phase power supply circuit of the frequency converter, and the air conditioner provided by some embodiments in the present disclosure, the current or power of the load of the three-phase power supply circuit is increased when a fault occurs in the three-phase power supply circuit, and the fault type of the three-phase power supply circuit may be determined according to the frequency of the ripple voltage of the bus voltage after the current or power is increased. In this way, the fault type of the three-phase power supply circuit can be quickly determined simply based on the main loop of the three-phase power supply circuit.

BRIEF DESCRIPTION OF THE DRAWINGS

To describe the embodiments of the present disclosure more clearly, in the following, the accompanying drawings needed for describing the embodiments will be briefly introduced. Apparently, the accompanying drawings in the following description illustrate merely some embodiments of the present disclosure.

FIGS. 7A and 7B are a schematic flowchart of yet another fault detection method for a three-phase power supply circuit of a frequency converter provided by some embodiments of the present disclosure.

EXPLANATION OF REFERENCE SIGNS

| Sign | Name | Sign | Name |
|------|------|------|------|
| 100 | Controller | 101 | Photoelectric coupler |
| 102 | First resistor | 103 | First capacitor |
| 104 | Second capacitor | 105 | Second resistor |
| 106 | First diode | 107 | Third resistor |
| 108 | Second diode | 200 | Power protection filter unit |
| 201 | Rectifier unit | 202 | Inverter unit |
| 203 | Load | 204 | Inductor |
| 205 | Electrolytic capacitor | 206 | Second switching device |
| 207 | First switching device | 208 | Third switching device |
| 209 | Fourth resistor | 210 | Ripple voltage |

DETAILED DESCRIPTION OF THE DISCLOSURE

Figure 1:
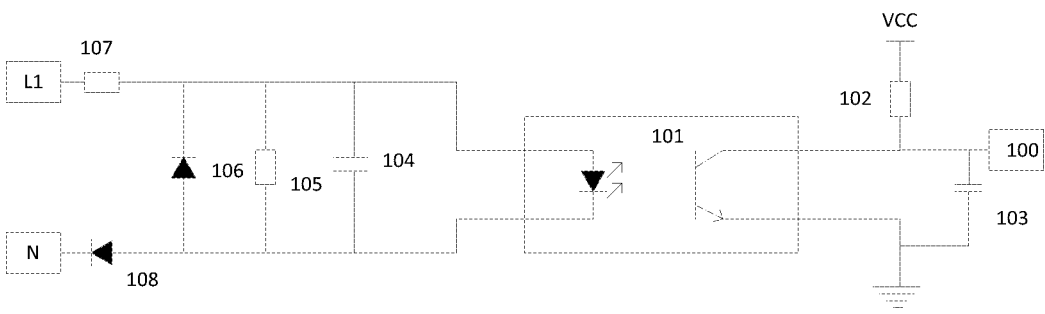
FIG. 1 is an existing fault detection circuit.

FIG. 1 is an existing fault detection circuit. The fault detection circuit shown in FIG. 1 can detect phase missing and phase sequence problems in a three-phase power supply.

As shown in FIG. 1, a photoelectric coupler 101 (PC817) is provided between each phase live line of the three-phase power supply circuit and a controller 100 on a control board. On one side of the control board, the controller 100 introduces a three-phase force electricity VCC and reduces the voltage through a high-power first resistor 102. One end of the first capacitor 103 is connected to the controller 100 and the other end is grounded. On one side of the three-phase power supply circuit, the live line L1 and the neutral line N are both connected to the photoelectric coupler 101. A second capacitor 104, a second resistor 105 and a first diode 106 are respectively provided between the live line L1 and the neutral line N. The anode of the first diode 106 is connected to the neutral line N, and the cathode of the first diode 106 is connected to the live line L1. A third resistor 107 is also provided on the live line L1, and a second diode 108 is provided on the neutral line N.

Figure 2:
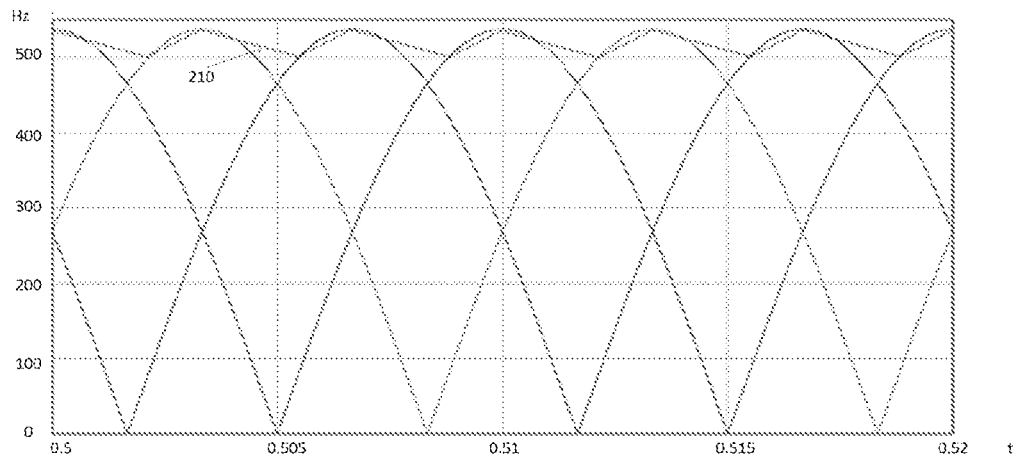
FIG. 2 is a schematic diagram of a three-phase rectified line voltage and a ripple voltage provided by some embodiments of the present disclosure.

The detection of three-phase imbalance can be determined by collecting the amplitude and frequency of the ripple voltage of the bus, or based on the higher-order harmonic component. FIG. 2 is a schematic diagram of a three-phase rectified line voltage and a ripple voltage provided by some embodiments of the present disclosure. As shown in FIG. 2, the frequency of AC input is 50 Hz, then when the three phases are completely symmetric, the frequency of the ripple voltage 210 is 300 Hz, and the magnitude of the ripple voltage 210 and the size of the capacitance are related to the load power. If the three phases are balanced and the load power is stable, the magnitude of the ripple voltage 210 changes in the same way in each cycle; if the three-phase voltages are slightly imbalanced, the magnitude of the ripple voltage 210 will not be exactly the same in each cycle. Some cycles have larger ripple voltage 210, while others have smaller ripple voltage 210, and the amplitude of the whole ripple voltage 210 will be larger than that in the case where the three phases are balanced; if the three-phase phases are slightly imbalanced, some cycles have long charging periods, others have short charging periods, and the amplitude of the ripple voltage 210 becomes larger; if the three-phase phases are severely imbalanced, it may be impossible to charge in some periods, and the amplitude of the ripple voltage 210 will increase dramatically, and the frequency will change from 300 Hz to 100 Hz, which is consistent with the phase missing.

The fault detection circuit shown in FIG. 1 above can detect the phase missing of the three-phase power supply, and the three-phase imbalance can be detected through the ripple voltage shown in FIG. 2. However, a three-phase force electricity needs to be introduced into the control board of the separate fault detection circuit, which needs a high-power resistor to step down, thus causing serious heating and occupy a large area of a PCB, thus resulting in a complicated circuit structure of the three-phase power supply circuit. The detection of the fault type of the three-phase power supply circuit cannot be realized quickly by only relying on the main loop of the existing three-phase power supply circuit.

In order to solve the above problems, the present disclosure provides a fault detection method and apparatus for a three-phase power supply circuit and an air conditioner. Without an additional detection circuit and relying simply on the three-phase power supply circuit, the frequency of the ripple voltage is detected by increasing the load, to quickly determine whether three-phase imbalance occurs in the three-phase power supply circuit.

It can be understood that the execution subject body of the embodiments of the present disclosure may be a fault detection apparatus for a three-phase power supply circuit, which may be a part of a one device or another device, e.g., a controller such as a microcontroller unit (Microcontroller Unit, MCU).

In the following, the embodiments of the present disclosure will be clearly and comprehensively described with reference to the accompanying drawings in the embodiments of the present disclosure. Apparently, the described embodiments are merely a part rather than all embodiments of the present disclosure.

Figure 3:
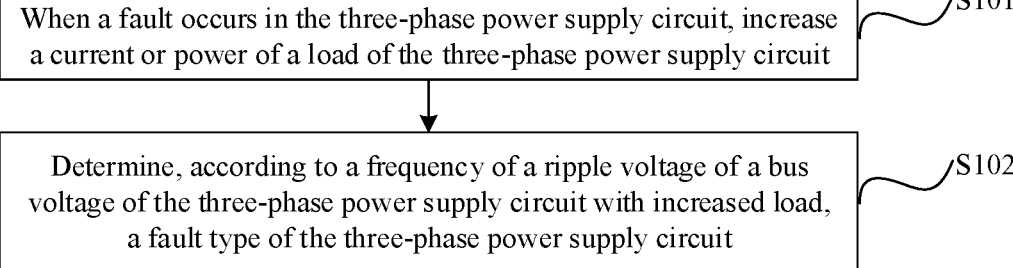
FIG. 3 is a schematic flowchart of a fault detection method for a three-phase power supply circuit of a frequency converter provided by some embodiments of the present disclosure.

FIG. 3 is a schematic flowchart of a fault detection method for a three-phase power supply circuit of a frequency converter provided by some embodiments of the present disclosure. As shown in FIG. 3, some embodiments of the present disclosure relate to specific ways of how to detect a fault type of a three-phase power supply circuit. The execution subject body of this embodiment is a controller. As shown in FIG. 3, the fault detection method for the three-phase power supply circuit of the frequency converter includes the following.

S101: when a fault occurs in the three-phase power supply circuit, increase a current or power of a load of the three-phase power supply circuit.

In some embodiments of the present disclosure, when a fault occurs in the three-phase power supply circuit, the controller may control the current or power of the load of the three-phase power supply circuit to increase by sending a control signal.

It should be understood that some embodiments of the present disclosure are about how to increase the current or power of the load. Exemplarily, if the system of the three-phase power supply circuit allows, the current or power of the load can be increased by increasing the frequency or other control adjustments (such as controlling a valve body or the like).

It should be understood that in some embodiments of the present disclosure, there is no limitation on how to determine the fault in the three-phase power supply circuit. In some embodiments, if an amplitude of a ripple voltage of a bus voltage is greater than an amplitude threshold and a frequency of the ripple voltage is within a second frequency range, it is determined that the three-phase power supply circuit has a fault. Correspondingly, if the amplitude of the ripple voltage of the bus voltage is less than or equal to the amplitude threshold or the frequency of the ripple voltage is not within the second frequency range, it is determined that the three-phase power supply circuit has no fault.

Among them, the ripple voltage of the bus voltage can be a real-time ripple voltage of the three-phase power supply circuit under normal working conditions. In some embodiments, in order to detect whether a fault occurs in the three-phase power supply circuit, the controller can obtain the ripple voltage of the bus voltage in real time after being powered on.

It should be understood that in some embodiments of the present disclosure there is no limitation for the amplitude threshold, it can be set according to the actual three-phase power supply circuit.

It should be understood that in some embodiments of the present disclosure there is no limitation for the range of the second frequency range, it can be set according to actual conditions. In some embodiments, the second frequency range may be 1.5 times to 2.5 times the frequency of the input power supply of the three-phase power supply circuit. Exemplarily, if the frequency of the input power supply of the three-phase power supply circuit is 50 Hz, the second frequency range is 75 Hz-125 Hz.

It should be noted that in some embodiments, high-order harmonic components can also be used to replace the amplitude of the ripple voltage of the bus voltage to detect whether a fault occurs in the three-phase power supply circuit, which will not be described in detail in some embodiments of the present disclosure.

S102: determine, according to a frequency of a ripple voltage of a bus voltage of the three-phase power supply circuit with increased load, a fault type of the three-phase power supply circuit.

In this step, when the controller increases the current or power of the load of the three-phase power supply circuit, the controller can obtain the frequency of the ripple voltage of the bus voltage of the three-phase power supply circuit with increased load. Therefore, the fault type of the three-phase power supply circuit is determined based on the frequency of the ripple voltage of the bus voltage of the three-phase power supply circuit with increased load.

It should be understood that in some embodiments of the present disclosure there is no limitation on how to obtain the frequency of the ripple voltage of the bus voltage of the three-phase power supply circuit, and common methods for acquiring the frequency of the ripple voltage can be adopted.

Among them, the fault type of the three-phase power supply circuit can include three-phase imbalance and phase missing. It should be noted that, current central air conditioners all adopt full frequency conversion technology, and the wrong phase sequence will not affect the normal operation of the central air conditioners. Therefore, the wrong phase sequence is not regarded as the fault type of the three-phase power supply circuit to be detected in some embodiments of the present disclosure.

In some embodiments of the present disclosure, there is no limitation on how to determine the fault type of the three-phase power supply circuit based on the frequency of the ripple voltage of the bus voltage of the three-phase power supply circuit with increased load. In some embodiments, if the frequency of the ripple voltage is within the first frequency range, it can be directly determined that the fault type of the three-phase power supply circuit is three-phase imbalance, to enable rapid determination of the fault type of the three-phase power supply circuit.

In other embodiments, if the frequency of the ripple voltage is not within the first frequency range, it is necessary to adjust the bus voltage of the three-phase power supply circuit by switching the switching state of the switching device in the three-phase power supply circuit, and reacquire the adjusted bus voltage of the three-phase power supply circuit after the state of the switching device is switched. Finally, the fault type of the three-phase power supply circuit is determined according to the adjusted bus voltage of the three-phase power supply circuit.

It should be understood that in some embodiments of the present disclosure, there is no limitation for the value of the first frequency range, in some embodiments, the first frequency range may be 5.5 times to 6.5 times the frequency of the input power supply of the three-phase power supply circuit.

Exemplarily, when the frequency of the ripple voltage of the bus voltage of the three-phase power supply circuit after the load is increased is 5.5 times, 6 times or 6.5 times of a frequency of an input power of the three-phase power supply circuit, the fault type of the three-phase power supply circuit is three-phase imbalance.

Exemplarily, if a frequency of an input power of the three-phase power supply circuit is 50 Hz, the first frequency range can be 275 Hz-325 Hz. Correspondingly, when the fault type of the three-phase power supply circuit is three-phase imbalance, the bus voltage ripple voltage after the three-phase power supply circuit increases the load can be 275 Hz, 300 Hz or 325 Hz.

Among them, the state switching can be to switch the switching device from off to on, or to switch the switching device from on to off.

The specific way of switching the state of the switching device will be described below.

Figure 4:
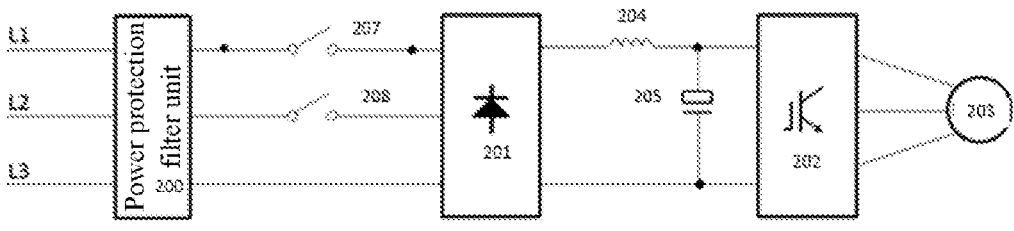
FIG. 4 is a schematic diagram of a main loop of a three-phase power supply circuit of a frequency converter provided by some embodiments in this disclosure.

FIG. 4 is a schematic diagram of a main loop of a three-phase power supply circuit of a frequency converter provided by some embodiments in this disclosure. As shown in FIG. 4, the main loop of the three-phase power supply circuit is provided with a power protection filter unit 200, a rectifier unit 201, an inverter unit 202 and a load 203. An inductor 204 is connected in series on the bus between the rectifier unit 201 and the inverter unit 202, and an electrolytic capacitor 205 is arranged between the two buses. Between the power protection filter unit 200 and the rectifier unit 201, a first switching device 207 is connected in series on a phase line L1 of the three-phase power supply circuit, and a third switching device 208 is connected in series on a phase line L2 of the three-phase power supply circuit.

Figure 5:
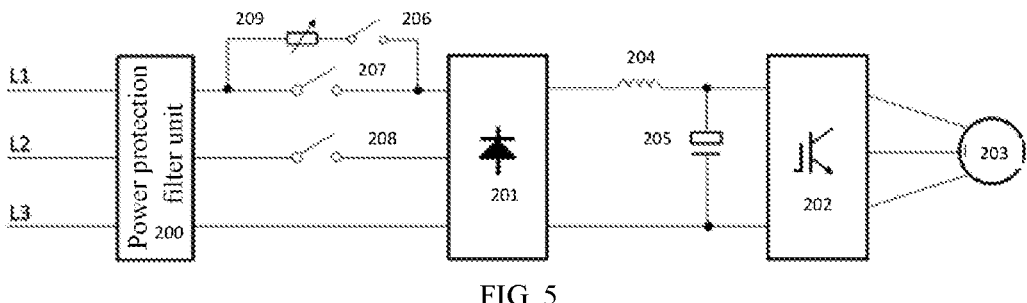
FIG. 5 is a schematic diagram of a main loop of another three-phase power supply circuit of a frequency converter provided by some embodiments of the present disclosure.

FIG. 5 is a schematic diagram of a main loop of another inverter three-phase power supply circuit provided by some embodiments in this disclosure. As shown in FIG. 5, on the basis of the three-phase power supply circuit shown in FIG. 4, a fourth resistor 209 and a second switching device 206 are additionally provided. The fourth resistor 209 is connected in series with the second switching device 206 and then connected in parallel with the first switching device 207.

Continuing to refer to FIG. 5, before the device is turned on, after the three-phase power supply passes through the power protection filter unit, the second switching device 206 is first closed. L1 and L3 pre-charge the electrolytic capacitor 205 through the fourth resistor 209 and the second switching device 206, and then the first switching device 207 and the third switching device 208 are closed after a period of time. After the first switching device 207 and the third switching device 208 are closed, the second switching device 206 can be disconnected, or the second switching device 206 can be kept closed before the device is turned on.

It should be understood that in some embodiments of the present disclosure, there is no limitation on the types of the above-mentioned switching devices. In some embodiments, the above-mentioned switching devices may be low-power switching devices.

It should be understood that in some embodiments of the present disclosure, there is no limitation on how to control the state switching of the switching device. Two manners of state switching for the switching device are provided below.

In the first manner, the controller can control the first switching device to be disconnected directly.

In some embodiments, if the three-phase power supply circuit also includes a second switching device, and the second switching device is connected in parallel with the first switching device, the controller can determine whether the second switching device is in an off state after the first switching device in the control three-phase power supply circuit is disconnected. If the second switching device is in the on state, the second switching device is disconnected.

It should be noted that the second switching device is turned off during normal operation.

Accordingly, if the adjusted bus voltage of the three-phase power supply circuit is less than the voltage threshold, it is determined that the fault type of the three-phase power supply circuit is phase missing.

If the bus voltage of the three-phase power supply circuit is greater than or equal to the voltage threshold, the second manner can be used to determine whether the fault type of the three-phase power supply circuit is three-phase imbalance.

In the second manner, the second switching device and the first switching device can be controlled to close sequentially, and then the third switching device in the three-phase power supply circuit is controlled to be disconnected. The third switching device is connected in series on the second phase live line of the three-phase power supply circuit.

Correspondingly, if the adjusted bus voltage of the three-phase power supply circuit is less than the voltage threshold, the fault type of the three-phase power supply circuit is determined to be phase missing. If the adjusted bus voltage of the three-phase power supply circuit is greater than or equal to the voltage threshold, the fault type of the three-phase power supply circuit is determined to be three-phase imbalance.

It should be noted that in some embodiments of the present disclosure, there is no limitation on the value of the voltage threshold, which can be set according to the actual situations. For example, the voltage threshold may be a low voltage protection value for the three-phase power supply circuit.

It should be noted that the above-mentioned second manner can be executed after the first manner is executed, or can be executed directly, which is not limited in some embodiments of the present disclosure. In some embodiments, after adopting the first manner, the controller can obtain the bus voltage of the three-phase power supply circuit, to determine that the fault is phase missing, and there is no need to adopt the second manner. If it cannot be determined that the fault type of the three-phase power supply circuit is phase missing, the second manner can be used to continue to detect the fault type of the three-phase power supply circuit.

It should be understood that in some embodiments of the present disclosure, if the controller uses multiple manners for controlling the switching devices in the three-phase power supply circuit to switch their states, the adjusted bus voltage of the three-phase power supply circuit is obtained when each manner is adopted for controlling the switching devices in the three-phase power supply circuit to switch their states.

Exemplarily, after first adopting the first manner to disconnect the first switching device, the controller can obtain the adjusted bus voltage of the three-phase power supply circuit for one time. When the controller adopts the second manner to control the second switching device and the first switching device to close in sequence, and then controls the third switching device in the three-phase power supply circuit to be opened, the controller can obtain the adjusted bus voltage of the three-phase power supply circuit one more time.

It is noted that in some embodiments, before the controller controls the switching devices in the three-phase power supply circuit to switch their states, the frequency of the input power of the three-phase power supply circuit can be reduced and the current of the three-phase power supply circuit is reduced to a first preset value, the first preset value being a value of the current at which disconnection of the switching devices in the three-phase power supply circuit would not cause damages to contacts.

In some embodiments, after the current of the three-phase power supply circuit is reduced to the first preset value, low-current operation can be maintained. By reducing the current of the three-phase power supply circuit to the first preset value, the contacts can be protected from being damaged during the state switching of the switching devices, to ensure the accuracy of the fault detection.

Some embodiments in the present disclosure provide a fault detection method for a three-phase power supply circuit, in which a current or power of a load of the three-phase power supply circuit is increased when a fault occurs in the three-phase power supply circuit, and a fault type of the three-phase power supply circuit is then determined based on a frequency of a ripple voltage of a bus voltage after the current or power is increased. In this way, the fault type of the three-phase power supply circuit can be quickly determined simply based on the main loop of the three-phase power supply circuit.

Figure 6:
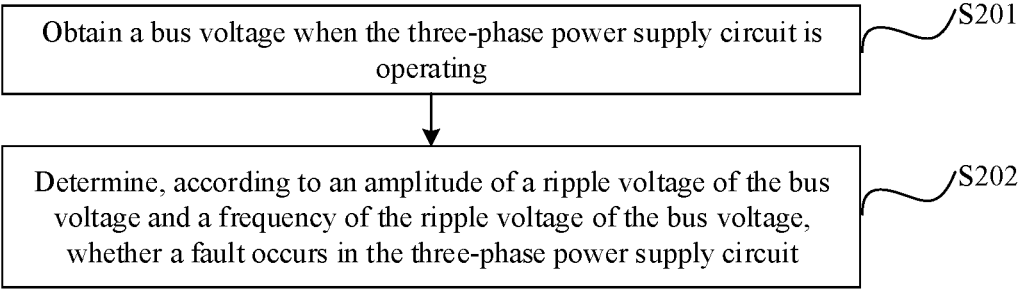
FIG. 6 is a schematic flowchart of another fault detection method for a three-phase power supply circuit of a frequency converter provided by some embodiments of the present disclosure.

On the basis of the above embodiments, the following is a description of how to determine that a fault occurs in a three-phase power supply circuit. FIG. 6 is a schematic flowchart of another fault detection method for a three-phase power supply circuit of a frequency converter provided by some embodiments of the present disclosure. As shown in FIG. 6, the fault detection method for the three-phase power supply circuit includes the following.

S201: obtain a bus voltage when the three-phase power supply circuit is operating.

Among them, the bus voltage is a real-time ripple voltage of the three-phase power supply circuit operating in a normal operating state.

It should be understood that in some embodiments of the present disclosure, the controller can obtain the bus voltage in real time after being powered on, to detect whether a fault occurs in the three-phase power supply circuit.

S202: determine, according to an amplitude of a ripple voltage of the bus voltage and a frequency of the ripple voltage of the bus voltage, whether a fault occurs in the three-phase power supply circuit.

In some embodiments of the present disclosure, there is no limitation on how to determine whether a fault occurs in the three-phase power supply circuit. In some embodiments, if the amplitude of the ripple voltage of the bus voltage is greater than the amplitude threshold and the frequency of the ripple voltage is within the second frequency range, it is determined the fault occurs in the three-phase power supply circuit. If the amplitude of the ripple voltage of the bus voltage is less than or equal to the amplitude threshold or the frequency of the ripple voltage is not within the second frequency range, it is determined that there is no fault in the three-phase power supply circuit.

It should be understood that in some embodiments of the present disclosure, there is no limitation on the amplitude threshold and the second frequency range, which may be set according to the actual situations. In some embodiments, the second frequency range is from 1.5 times to 2.5 times the frequency of the input power supply of the three-phase power supply circuit. Exemplarily, a fault occurs in the three-phase power supply circuit when the frequency of the ripple voltage of the bus voltage is 1.5 times, 2 times, or 2.5 times the frequency of the input power supply of the three-phase power supply circuit.

Exemplarily, if the frequency of the input power supply of the three-phase power supply circuit is 50 Hz, the third preset value is 75 Hz-125 Hz. Correspondingly, when a fault occurs in the three-phase power supply circuit, the frequency of the ripple voltage of the bus voltage can be 75 Hz, 100 Hz or 125 Hz, etc.

It should be noted that in some embodiments, high-order harmonic components can also be used instead of the amplitude of the second ripple voltage to detect whether a fault occurs in the three-phase power supply circuit, which is not be repeated in some embodiments of the present disclosure.

On the basis of the above embodiments, a specific flow-chart of fault detection for a three-phase power supply circuit is provided below. FIGS. 7A and 7B are a schematic flowchart of yet another fault detection method for a three-phase power supply circuit of a frequency converter provided by some embodiments of the present disclosure. As shown in FIG. 7, the fault detection method for the three-phase power supply circuit includes the following.

S301: detect a ripple voltage in real time during operation.

S302: determine whether an amplitude of the ripple voltage exceeds an amplitude threshold and whether a whole frequency of the ripple voltage is within a range of 75 Hz-125 Hz.

If yes, step S303 is executed; if no, step S301 is executed.

S303: increase a current or power of a load of the three-phase power supply circuit if the system control allows.

In this step, if the system allows, increase the frequency or make other control adjustments (such as controlling the valve body, etc.) to increase the load, to increase the whole frequency of the ripple voltage of the three-phase power supply circuit.

S304: obtain the ripple voltage of the three-phase power supply circuit.

S305: determine whether the frequency of the ripple voltage is within the range of 275 Hz-325 Hz.

If yes, step S315 is executed; if no, step S306 is executed.

S306: reduce the frequency of the input power of the three-phase power supply circuit until the first switch-ing device and the third switching device can be disconnected.

Turning now to FIG. 7B, at step S307: determine whether the second switching device is in a closed state.

If yes, step S309 is executed; if no, step S308 is executed.

S308: disconnect the first switching device.

S309: first disconnect the first switching device and then disconnect the second switching device.

After steps S308 and S309, step S310 is executed.

S310: determine whether the bus voltage is less than a low voltage protection value.

If yes, step S314 is executed, and if no, step S311 is executed.

S311: first close the second switching device and then close the first switching device.

S312: disconnect the third switching device.

S313: determine whether the bus voltage is less than the low voltage protection value.

If yes, step S314 is executed, and if no, step S315 is executed.

S314: determine that the fault type is phase missing.

S315: determine that the fault type is three-phase imbal-ance.

Figure 8:
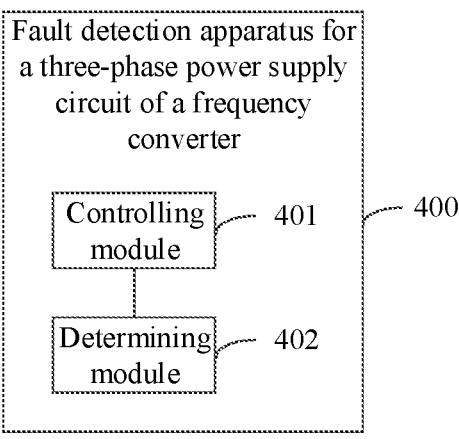
FIG. 8 is a schematic structural diagram of a fault detection apparatus for a three-phase power supply circuit of a frequency converter provided by some embodiments of the present disclosure.

FIG. 8 is a schematic structural diagram of a fault detection apparatus for a three-phase power supply circuit of a frequency converter provided by some embodiments of the present disclosure. The fault detection apparatus for the three-phase power supply circuit can be realized by soft-ware, hardware or a combination of the two, such as the controller in the above embodiments, to execute the fault detection method for the three-phase power supply circuit of the frequency converter in the above embodiments. As shown in FIG. 8, the fault detection apparatus 400 for the three-phase power supply circuit of the frequency converter includes a controlling device 401 and a determining device 402.

The controlling device 401 is configured to increase a current or power of a load of the three-phase power supply circuit when a fault occurs in the three-phase power supply circuit; and the determining device 402 is configured to determine a fault type of the three-phase power supply circuit according to a frequency of a ripple voltage of a bus voltage of the three-phase power supply circuit with increased load.

Further, the determining device 402 is configured to determine that the fault type of the three-phase power supply circuit is three-phase imbalance, if the frequency of the ripple voltage of the bus voltage of the three-phase power supply circuit with increased load within a first frequency range.

Further, the first frequency range is 5.5 times to 6.5 times a frequency of an input power of the three-phase power supply circuit.

Further, the determining device 402 is further configured to determine that the fault occurs in the three-phase power supply circuit, if an amplitude of the ripple voltage of the bus voltage of the three-phase power supply circuit is greater than an amplitude threshold and the frequency of the ripple voltage of the bus voltage is within a second frequency range.

Further, the second frequency range is 1.5 times to 2.5 times a frequency of an input power of the three-phase power supply circuit.

Further, the determining device 402 is configured to: if the frequency of the ripple voltage is not within a first frequency range, switch a switching state of a switching device in the three-phase power supply circuit to adjust the bus voltage of the three-phase power supply circuit; and determine the fault type of the three-phase power supply circuit according to the adjusted bus voltage of the three-phase power supply circuit.

Further, the determining device 402 is configured to control a first switching device in the three-phase power supply circuit to be disconnected, where the first switching device is connected in series on a first phase live line of the three-phase power supply circuit.

Further, if the three-phase power supply circuit further includes a second switching device, and the second switching device is connected in parallel with the first switching device, the determining device 402 is configured to disconnect the second switching device if the second switching device is in a closed state.

Further, the determining device 402 is configured to determine that the fault type of the three-phase power supply circuit is phase missing, if the adjusted bus voltage of the three-phase power supply circuit is less than a voltage threshold.

Further, the determining device 402 is configured to control a second switching device in the three-phase power supply circuit and a first switching device in the three-phase power supply circuit to close sequentially; and control a third switching device in the three-phase power supply circuit to be disconnected, where the third switching device is connected in series on a second phase live line of the three-phase power supply circuit.

Further, the determining device 402 is configured to determine that the fault type of the three-phase power supply circuit is phase missing if the adjusted bus voltage of the three-phase power supply circuit is less than a voltage threshold; and determine that the fault type of the three-phase power supply circuit is three-phase imbalance if the adjusted bus voltage of the three-phase power supply circuit is greater than or equal to the voltage threshold.

It should be noted that the fault detection apparatus for the three-phase power supply circuit provided in the embodiment shown in FIG. 8 can be set to execute the fault detection method for the three-phase power supply circuit provided in any of the above embodiments, and the specific implementation manners and effects are similar, which will not be repeated here.

Figure 9:
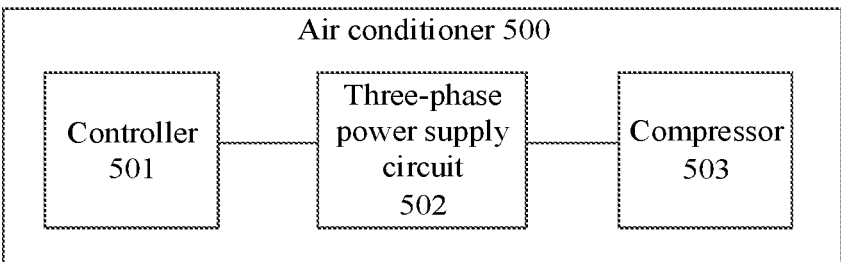
FIG. 9 is a schematic structural diagram of an air conditioner provided by some embodiments of the present disclosure.

FIG. 9 is a schematic structural diagram of an air conditioner provided by some embodiments of the present disclosure. As shown in FIG. 9, the air conditioner 500 includes a controller 501, a three-phase power supply circuit 502 and a compressor 503.

The controller is configured to execute the fault detection method described above for the three-phase power supply circuit 502, and the three-phase power supply circuit 502 is configured to provide power supply for the compressor 503.

The compressor 503 is configured to support cooling or heating of the air conditioner.

Figure 10:
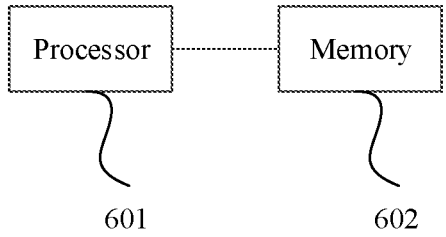
FIG. 10 is a schematic structural diagram of an electronic device provided by some embodiments of the present disclosure.

FIG. 10 is a schematic structural diagram of an electronic device provided by some embodiments of the present disclosure. As shown in FIG. 10, the electronic device may include: at least one processor 601 and at least one memory 602. FIG. 10 shows an electronic device with a processor as an example.

The memory 602 is configured to store programs. In one embodiment, a program may include program codes which include computer operation instructions.

The memory 602 may include a high-speed RAM memory, and may also include a non-volatile memory (non-volatile memory), such as at least one disk memory.

The processor 601 is configured to execute the computer execution instructions stored in the memory 602 to implement the above-mentioned fault detection method for the three-phase power supply circuit.

Among them, the processor 601 may be a central processing unit (Central Processing Unit, CPU for short), or an application specific integrated circuit (Application Specific Integrated Circuit, ASIC for short), or be configured as one or more integrated circuits for implementing some embodiments of the present disclosure.

In one embodiment, in terms of specific implementations, if the communication interface, the memory 602 and the processor 601 are implemented independently, the communication interface, the memory 602 and the processor 601 can be connected to each other through a bus and complete communication with each other. The bus can be an industry standard architecture (Industry Standard Architecture, ISA for short) bus, a peripheral component (Peripheral Component, PCI for short) bus or an extended industry standard architecture (Extended Industry Standard Architecture, EISA for short) bus, etc. The bus can include an address bus, a data bus, a control bus, etc., but it does not mean that there is only one bus or one type of bus.

In one embodiment, in terms of specific implementations, if the communication interface, the memory 602 and the processor 601 are integrated on a chip, the communication interface, the memory 602 and the processor 601 can communicate through an internal interface.

Some embodiments of the present disclosure also provide a chip that is connected to the three-phase power supply circuit; and the chip includes a processor and a memory.

Among them, the processor is configured to call and run a computer program from the memory, and a device equipped with the chip executes the above-mentioned fault detection method for the three-phase power supply circuit.

The present disclosure also provides a computer-readable storage medium, the computer-readable storage medium may include: a USB flash drive, a removable hard disk, a read-only memory (ROM, Read-Only Memory), a random-access memory (RAM, Random Access Memory), a magnetic disk, an optical disk, or other kinds of mediums that can store program codes, and, the computer-readable storage medium has program information stored therein, and the program information is set to implement the fault detection method for the three-phase power supply circuit described above.

Some embodiments of the present disclosure also provide a program, which, when executed by a processor, is configured to perform the fault detection method for the three-phase power supply circuit provided by the above method embodiments.

Some embodiments of the present disclosure also provide a program product, such as a computer-readable storage medium, which has instructions stored therein, when the instructions are run on a computer, the computer is caused to perform the fault detection method for the three-phase power supply circuit provided by the method embodiments described above.

The above embodiments may be implemented in whole or in part by software, hardware, firmware, or any combination thereof. When implemented using software, they can be implemented in whole or in part in the form of a computer program product. The computer program product includes one or more computer instructions. When the computer program instructions are loaded and executed on a computer, processes or functions of some embodiments of the present disclosure are produced in whole or in part. The computer may be a general computer, a special purpose computer, a computer network, or other programmable apparatuses. The computer instructions may be stored in a computer-readable storage medium or transmitted from one computer-readable storage medium to another computer-readable storage medium, e.g., the computer instructions may be transmitted in a wired manner (e.g., through a coaxial cable, an optical fiber, a digital subscriber line (DSL)) or in a wireless manner (e.g., infrared, wireless, microwave, etc.) from one website site, computer, server, or data center to another website site, computer, server, or data center. The computer-readable storage medium can be any available medium that can be accessed by a computer, or a data storage device such as a server or data center that includes one or more available mediums integrated. The available medium may be a magnetic medium (e.g., a floppy disk, a hard disk, a magnetic tape), an optical medium (e.g., DVD), or a semiconductor medium (e.g., a solid state disk (SSD)), etc.

In the description of some embodiments of the present disclosure, it is to be understood that terms indicating orientations or positional relationships, such as "center", "longitudinal", "lateral", "length", "width", "thickness", "up", "down", "front", "back", "left", "right", "vertical", "horizontal", "top", "bottom", "inside", "outer", "clock-wise", "counterclockwise", "axial", "radial," "circumferen-tial" or the like are based on orientations or positional relationships shown in the drawings, and these terms are only for the convenience of describing the embodiments of the present disclosure and simplifying the description, rather than indicating or implying that the device or element referred to must have a particular orientation, be constructed and operate in a particular orientation, and therefore should not be construed as limiting the embodiments of the present disclosure.

In the description of the present specification, the description made with reference to terms "an embodiment", "some embodiments", "an example", "a specific example", or "some examples" mean that specific features, structures, materials, or characteristics described in conjunction with the embodiment or example are included in at least one embodiment or example of the present disclosure. In this specification, the schematic expressions of the above terms are not necessarily directed to the same embodiment or example. Furthermore, the specific features, structures, materials or characteristics described may be combined in any suitable manner in any one or more embodiments or examples.

What is claimed is:

1. An air conditioner, wherein the air conditioner comprises:

a controller, a three-phase power supply circuit and a compressor;

wherein the controller is configured to execute a fault detection method for the three-phase power supply circuit of a frequency converter, the fault detection method comprising:

when a fault occurs in the three-phase power supply circuit, increasing a current or power of a load of the three-phase power supply circuit; and determining, according to a frequency of a ripple voltage of a bus voltage of the three-phase power supply circuit with increased load, a fault type of the three-phase power supply circuit, comprising:

if the frequency of the ripple voltage of the bus voltage of the three-phase power supply circuit with increased load is within a first frequency range, determining that the fault type of the three-phase power supply circuit is three-phase imbalance;

wherein the three-phase power supply circuit is configured to provide power supply for the compressor; and wherein the compressor is configured to support cooling or heating of the air conditioner.

2. The air conditioner according to claim 1, wherein the first frequency range is 5.5 times to 6.5 times a frequency of an input power of the three-phase power supply circuit.

3. The air conditioner according to claim 1, wherein before increasing the current or power of the load of the three-phase power supply circuit, further comprises:

if an amplitude of the ripple voltage of the bus voltage of the three-phase power supply circuit is greater than an amplitude threshold and the frequency of the ripple voltage of the bus voltage is within a second frequency range, determining that the fault occurs in the three-phase power supply circuit.

4. The air conditioner according to claim 3, wherein the second frequency range is 1.5 times to 2.5 times a frequency of an input power of the three-phase power supply circuit.

5. The air conditioner according to claim 1, wherein determining, according to the frequency of the ripple voltage of the bus voltage of the three-phase power supply circuit with increased load, the fault type of the three-phase power supply circuit further comprises:

if the frequency of the ripple voltage is not within a first frequency range, switching a switching state of a switch in the three-phase power supply circuit to adjust the bus voltage of the three-phase power supply circuit;

determining the fault type of the three-phase power supply circuit according to an adjusted bus voltage of the three-phase power supply circuit.

6. The air conditioner according to claim 5, wherein switching the switching state of the switch in the three-phase power supply circuit comprises:

controlling a first switch in the three-phase power supply circuit to be disconnected, wherein the first switch is connected in series on a first phase live line of the three-phase power supply circuit.

* * * * *